United States Patent
Chiu et al.

(10) Patent No.: US 8,400,177 B2
(45) Date of Patent: Mar. 19, 2013

(54) DEVICE AND METHOD FOR TESTING DISPLAY PANEL

(75) Inventors: Chien-Wei Chiu, Chiayi (TW); An-Ting Hsiao, Dali (TW)

(73) Assignee: Chimei Innolux Corporation (TW)

( * ) Notice: Subject to any disclaimer, the term of this patent is extended or adjusted under 35 U.S.C. 154(b) by 487 days.

(21) Appl. No.: 12/551,204

(22) Filed: Aug. 31, 2009

(65) Prior Publication Data

US 2010/0052719 A1 Mar. 4, 2010

Related U.S. Application Data

(60) Provisional application No. 61/093,442, filed on Sep. 1, 2008.

(30) Foreign Application Priority Data

May 11, 2009 (TW) ................................. 98115569 A

(51) Int. Cl.
*G01R 31/26* (2006.01)
*G01R 31/02* (2006.01)
*H01R 3/00* (2006.01)

(52) U.S. Cl. ............... 324/760.01; 324/762.01; 439/493
(58) Field of Classification Search . 324/760.01–760.02, 762.01, 762.08–762.09
See application file for complete search history.

(56) References Cited

U.S. PATENT DOCUMENTS

| | | | | |
|---|---|---|---|---|
| 5,801,545 A | * | 9/1998 | Takekoshi et al. | ........ 324/750.25 |
| 6,144,216 A | * | 11/2000 | Kajiwara et al. | ......... 324/760.01 |
| 6,150,833 A | * | 11/2000 | Lin et al. | .................. 324/760.02 |
| 6,603,467 B1 | * | 8/2003 | Wu | ................................ 345/204 |
| 7,091,738 B2 | * | 8/2006 | Nakano et al. | ............ 324/755.01 |
| 7,245,143 B2 | * | 7/2007 | Hasegawa et al. | ........ 324/760.01 |
| 7,782,045 B2 | * | 8/2010 | Wang et al. | ............... 324/757.01 |
| 7,896,688 B2 | * | 3/2011 | Sukegawa et al. | ............. 439/494 |
| 8,029,314 B2 | * | 10/2011 | Huang | ........................... 439/492 |
| 8,050,610 B2 | * | 11/2011 | Takagi et al. | .................. 399/329 |
| 8,121,732 B2 | * | 2/2012 | Hashimoto et al. | ........... 700/260 |
| 8,212,752 B2 | * | 7/2012 | Lee et al. | ......................... 345/87 |
| 2005/0025516 A1 | * | 2/2005 | Kinouchi et al. | ............... 399/90 |
| 2005/0135820 A1 | * | 6/2005 | Morihara et al. | ............... 399/33 |
| 2005/0157470 A1 | * | 7/2005 | Park et al. | ...................... 361/719 |
| 2007/0153226 A1 | * | 7/2007 | Lee | ................................ 349/192 |
| 2007/0287303 A1 | | 12/2007 | Wang et al. | |
| 2008/0001619 A1 | * | 1/2008 | Igarashi | ........................ 324/770 |

FOREIGN PATENT DOCUMENTS

| | | |
|---|---|---|
| CN | 101086508 | 12/2007 |
| CN | 101149892 | 3/2008 |
| TW | M249240 | 11/2004 |

* cited by examiner

*Primary Examiner* — Joshua Benitez Rosario
(74) *Attorney, Agent, or Firm* — Lowe Hauptman Ham & Berner, LLP

(57) ABSTRACT

A testing device is provided for testing a display panel including a first circuit board. The testing device includes a second circuit board and a pressing element. The second circuit board includes a main body, multiple test pads, multiple testing circuits and multiple conducting elements. The test pads are arranged on a first surface of the main body and corresponding to respective pins of the first circuit board. The testing circuits are formed on the second surface of the main body and corresponding to respective test pads. The first circuit board is stacked on the second circuit board. The testing circuits are electrically with respective pins through respective conducting elements and respective test pads. The pressing element presses a stacking region between the first circuit board and the second circuit board, thereby facilitating close contact between the first circuit board and the second circuit board.

8 Claims, 5 Drawing Sheets

DEVICE AND METHOD FOR TESTING DISPLAY PANEL

CROSS REFERENCE TO RELATED PATENT APPLICATION

The present application is based on, and claims priority from, U.S. provisional patent application No. 61/093,442 filed Sep. 1, 2008, and Taiwanese application No. 098115569, filed May 11, 2009, the disclosures of which are hereby incorporated by reference herein in their entirety.

FIELD OF THE INVENTION

The present invention relates to a testing device for testing a display panel, and more particularly to a testing device for testing a display panel by stacking the circuit boards of the testing device and the display panel. The present invention also relates to a method for testing a display panel.

BACKGROUND OF THE INVENTION

Generally, the display panel provided by the manufacturer has a flexible printed circuit (FPC) serving as a connector. After the display panel is received by the assembly factory (e.g. a mobile phone assembly factory), the flexible printed circuit of the display panel is inserted into an insertion slot of an electrical product (e.g. a mobile) in order to integrate the display panel into the electrical product.

Before the display panel leaves the factory, the manufacture of the display panel needs to implement a series of testing procedures in order to assure that the quality of the display panel is acceptable. For testing the display panel, the flexible printed circuit of the display panel is usually plugged in and unplugged from the testing system for many times. If the external force offered to plug/unplug the flexible printed circuit is improper, the flexible printed circuit is readily deformed or damaged. As such, the imaging quality of the display panel is deteriorated.

Furthermore, another testing system uses a thimble as a connector. When the thimble is contacted with the flexible printed circuit, the flexible printed circuit is readily scraped or even damaged by the thimble. Under this circumstance, the imaging quality of the display panel is also deteriorated.

Therefore, there is a need of providing improved testing device and method so as to obviate the drawbacks encountered from the prior art.

SUMMARY OF THE INVENTION

The present invention relates to a testing device and a testing method for testing a display panel in order to reduce the damage rate and enhance the quality of the display panel.

In accordance with an aspect of the present invention, there is provided a testing device for testing a display panel. The display panel includes a first circuit board. Multiple pins are arranged on the first circuit board. The testing device includes a second circuit board and a pressing element. The second circuit board includes a main body, a plurality of test pads, a plurality of testing circuits and a plurality of conducting elements. The main body has a first surface and a second surface. The test pads corresponding to respective pins of the first circuit board are arranged on the first surface of the main body. The testing circuits corresponding to respective test pads are formed on the second surface of the main body. The conducting elements are disposed through the main body for electrically connecting the testing circuits and the test pads. The pressing element is positioned on the test pads thereby facilitating close contact between the first circuit board and the second circuit board. When the first circuit board is stacked on the second circuit board, the testing circuits are electrically connected to respective pins through respective conducting elements and respective test pads.

In accordance with another aspect of the present invention, there is provided a display panel testing method. Firstly, a display panel including a first circuit board is provided, wherein the first circuit board has a plurality of pins. A testing device including a second circuit board is provided, wherein the second circuit board has a plurality of test pads corresponding to the pins of the first circuit board. Then, the first circuit board is stacked on the second circuit board such that the test pads are electrically connected to the pins. Afterwards, a pressing element is provided on a stacking of the first circuit board and the second circuit board, thereby facilitating close contact between the first circuit board and the second circuit board.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
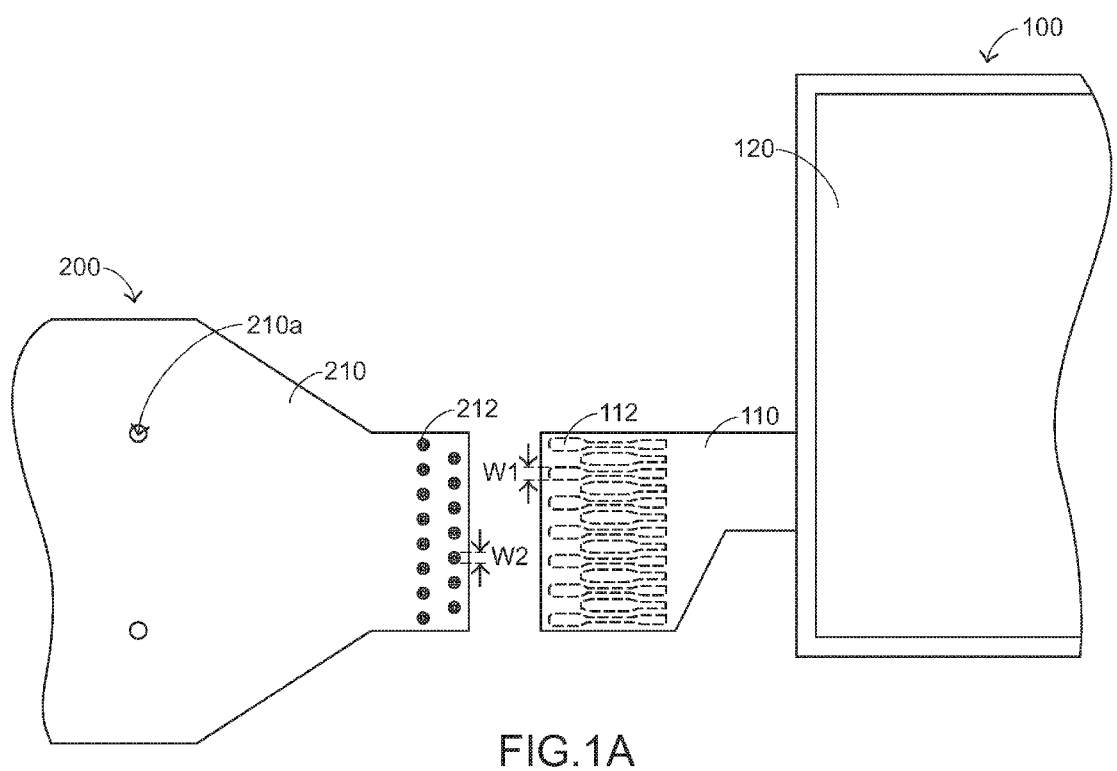
FIG. 1A is a schematic top view illustrating a testing device and a display panel to be tested by the testing device according to an embodiment of the present invention.
Figure 1B:
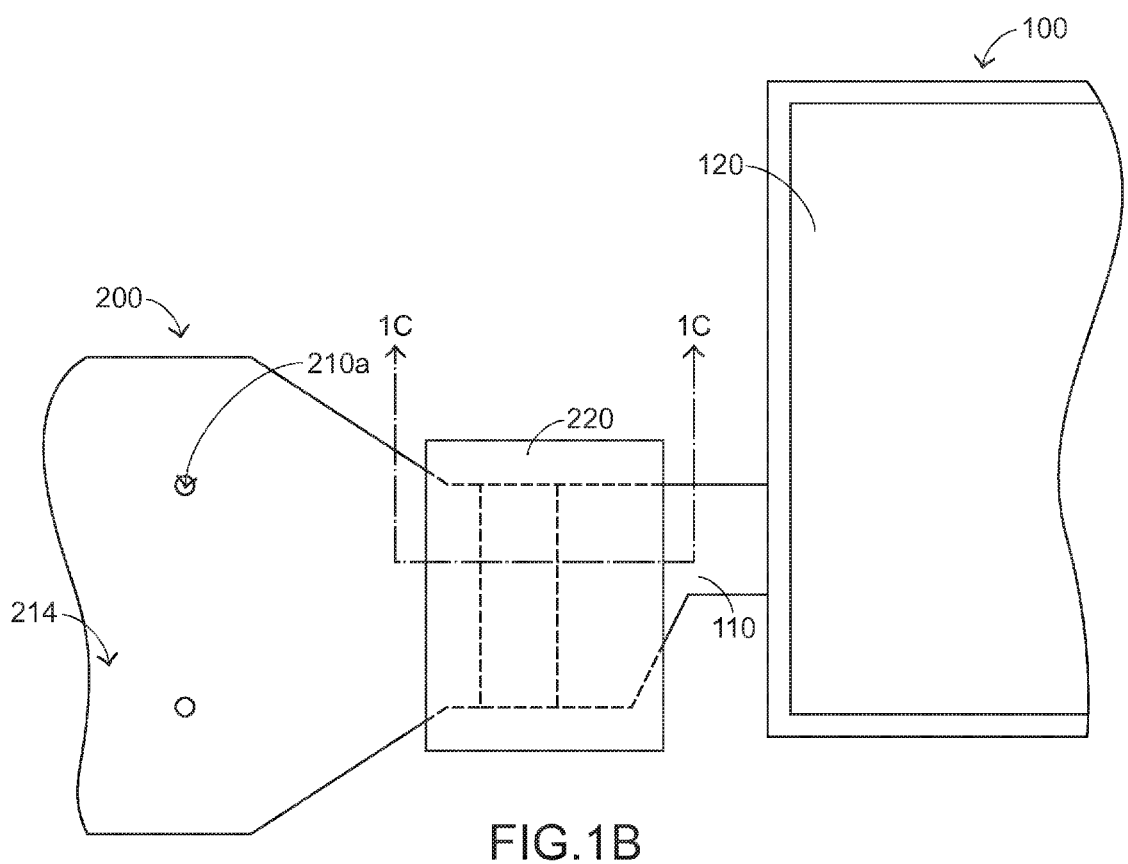
FIG. 1B is a schematic top view illustrating the electrical connection between the testing device and the display panel as shown in FIG. 1A.

FIG. 1A is a schematic top view illustrating a testing device and a display panel to be tested by the testing device according to an embodiment of the present invention. FIG. 1B is a schematic top view illustrating the electrical connection between the testing device and the display panel as shown in FIG. 1A. The testing device 200 is used for testing a display panel 100. The display panel 100 includes a first circuit board 110 and a display screen 120. Multiple pins 112 are formed on a surface of the first circuit board 110. In this embodiment, the testing device 200 comprises a second circuit board 210 and a pressing element 220 (see FIG. 1B). The second circuit board 210 comprises multiple test pads 212 corresponding to the pins 112 of the first circuit board 110. In this embodiment, the first circuit board 110 is a flexible printed circuit (FPC), and the pins 112 are collectively formed as a gold finger interface or an edge connector.

For testing the display panel 100, the first circuit board 110 is firstly stacked on the second circuit board 210 such that the pins 112 are electrically connected with respective test pads 212. After the first circuit board 110 is stacked on the second circuit board 210 and the pins 112 are electrically connected with respective test pads 212, the pressing element 220 is placed on the stacking region of the first circuit board 110 and the second circuit board 210. As a consequence, the first circuit board 110 and the second circuit board 210 are in close contact with each other. Next, the testing procedures are performed, and the testing results are shown on the display screen 120.

Please refer to FIG. 1A again. In this embodiment, the test pads 212 are ring-shaped. For facilitating tight contact between the test pad 212 and the corresponding pin 112, the diameter W2 of the test pad 212 is slightly smaller than the width W1 of the pin 112. For example, if the diameter W2 of the test pad 212 is 0.33 mm, the width W1 of the pin 112 is 0.3 mm.

Figure 1C:
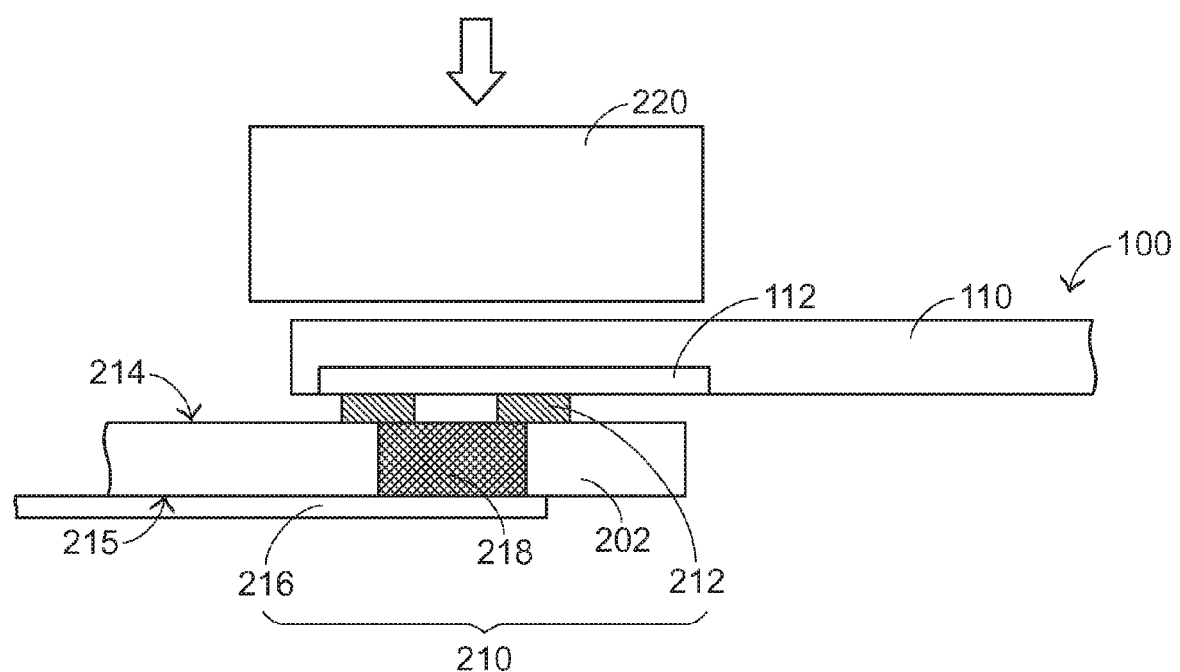
FIG. 1C is a schematic cross-sectional view illustrating the testing device and the display panel shown in FIG. 1B along line 1C-1C.

FIG. 1C is a schematic cross-sectional view illustrating the testing device and the display panel shown in FIG. 1B along the cross section line 1C-1C. In this embodiment, the pressing element 220 is movably placed on the stacking region of the first circuit board 110 and the second circuit board 210. It is preferred that the pressing element 220 is disposed over the test pads 212. Due to the weight of the pressing element 220, the first circuit board 110 is firmly stacked on the second circuit board 210, and the pins 112 are in close contact with respective test pads 212.

Please refer to FIG. 1C again. The second circuit board 210 of the testing device 200 comprises a main body 202, multiple test pads 212, multiple testing circuits 216 and multiple conducting elements 218. The main body 202 comprises a first surface 214 and a second surface 215. The test pads 212 are arranged on the first surface 214 of the main body 202. The testing circuits 216 are arranged on the second surface 215 of the main body 202. The testing circuits 216 are connected with the testing platform (not shown) of the testing device 200 for transmitting testing signals from the testing platform. Moreover, the conducting elements 218 run through the main body 202. Via the conducting elements 218, the testing circuits 216 are electrically connected with respective test pads 212. As such, the testing signals outputted from the testing platform could be transmitted to the display panel 100 through the testing circuits 216, the conducting elements 218 and the pins 112. Example of the conducting elements 218 include but are not limited to metallic wires, conductive blocks or other conductive articles. In this embodiment, the test pads 212 are ring-shaped pads. Nevertheless, the test pads 212 may have any shapes such as circular or rectangular shapes.

Figure 2:
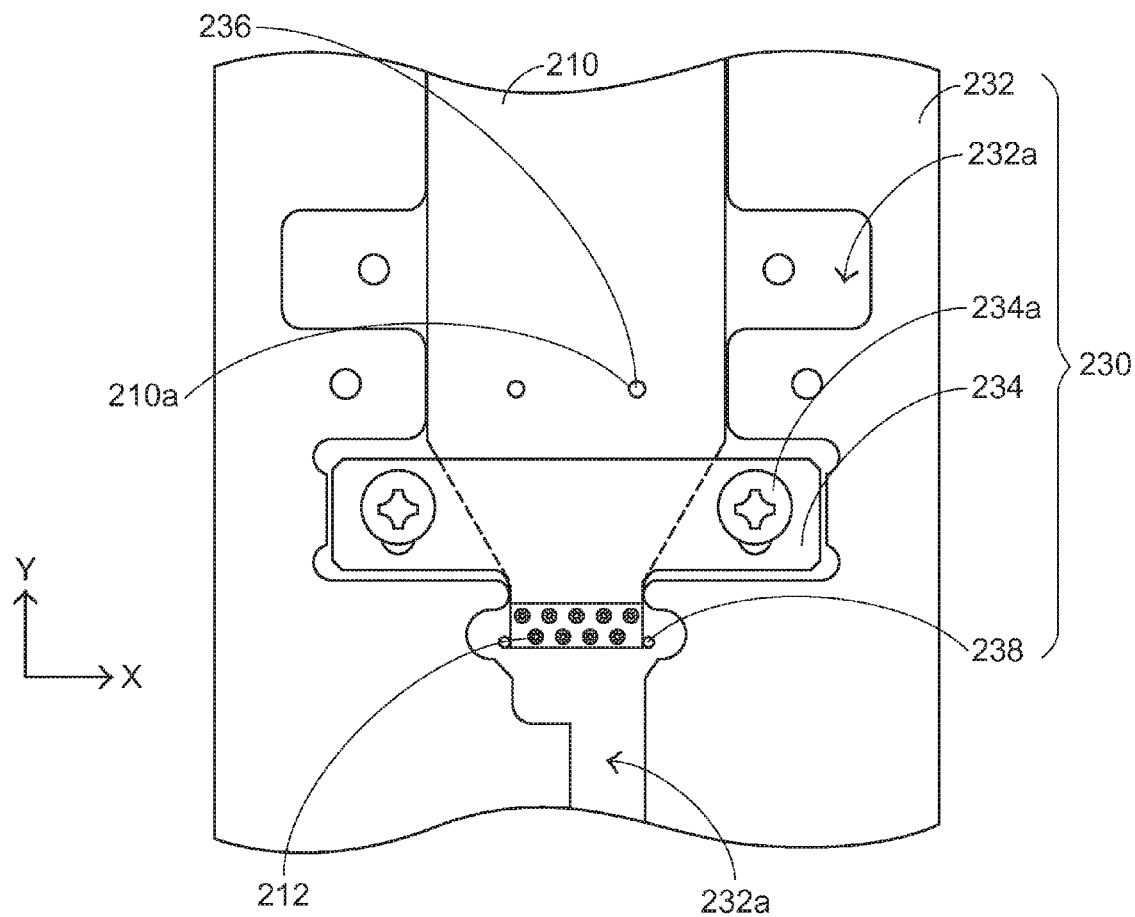
FIG. 2 is a schematic top view illustrating the second circuit board of the testing device of FIG. 1A and held by a fixing member.

FIG. 2 is a schematic top view illustrating the second circuit board of the testing device of FIG. 1A and held by a fixing member. For holding the second circuit board 210, the testing device 200 further comprises a fixing member 230. In practice, a large number of display panels 100 will be tested. After the second circuit board 210 is held by the fixing member 230, the first circuit boards 110 of the display panels 100 to be tested will be stacked on the second circuit board 210 of the testing device 200 one by one. Since only the display panel 100 to be tested is replaced in each testing cycle, the testing method of the present invention is more time-saving and labor-saving.

Please refer to FIG. 2 again. The fixing member 230 comprises a flat slab 232, a positioning plate 234, a first positioning post 236 and a second positioning post 238. A recess 232a is formed in the flat slab 232 for accommodating the second circuit board 210 and the first circuit board 110 to be tested (see FIG. 3). The shape of the recess 232a is specially designed to be fitted with the combination of the first circuit board 110 and the second circuit board 210 in the stacked form. As such, the combination of the first circuit board 110 and the second circuit board 210 in the stacked form could be firmly held in the recess 232a. In other words, during the testing procedure is performed, the first circuit board 110 and the second circuit board 210 could be maintained steady.

In this embodiment, two first positioning posts 236 are protruded from the bottom surface of the recess 232a of the flat slab 232. Corresponding to the first positioning posts 236, the second circuit board 210 has two first positioning holes 210a (see also FIG. 1A). When the first positioning posts 236 and respective first positioning holes 210a are engaged with each other, the second circuit board 210 could be fixed in the recess 232a of the flat slab 232 without being shifted in the X-direction or the Y-direction. After the second circuit board 210 is fixed in the recess 232a of the flat slab 232, the positioning plate 234 is placed on the second circuit board 210. By means of screws 234a, the positioning plate 234 is securely fixed in the recess 232a of the flat slab 232. Meanwhile, the second circuit board 210 is fixed by the positioning plate 234 while the test pads 212 are not sheltered by the positioning plate 234.

Figure 3:
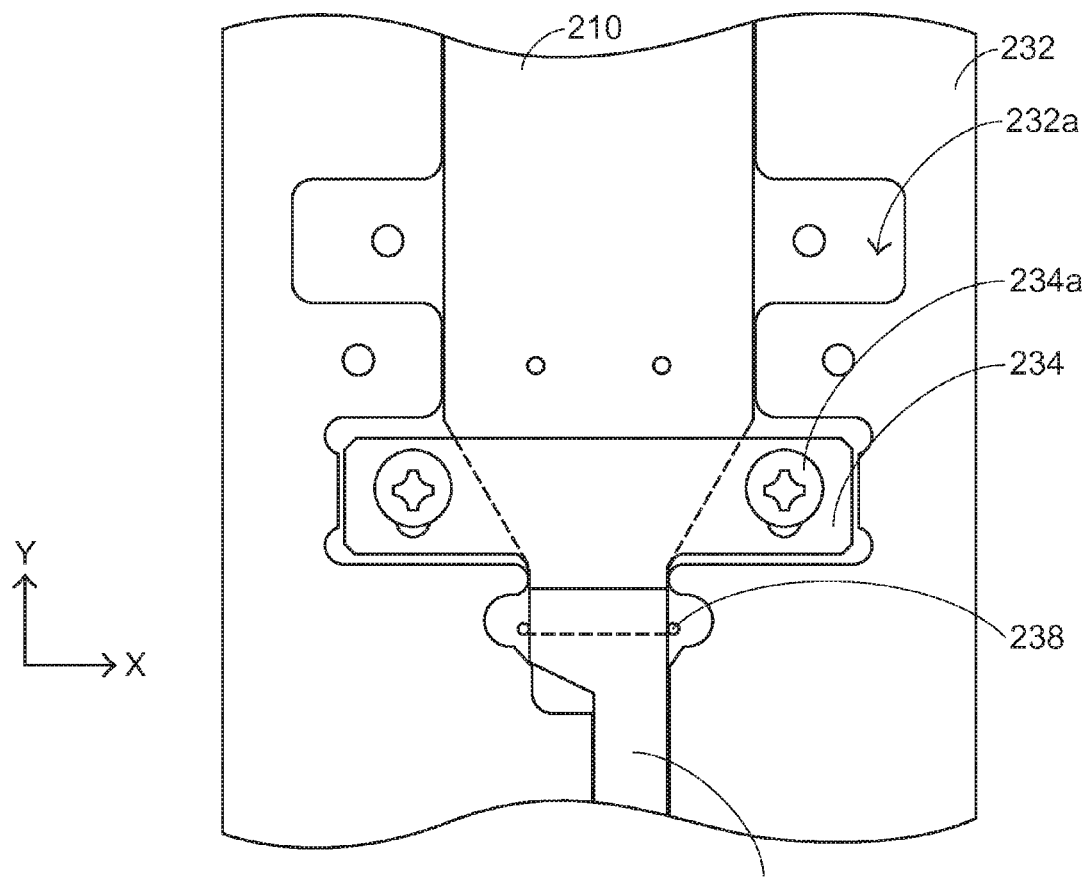
FIG. 3 is a schematic top view illustrating the first circuit board staked on the second circuit board of FIG. 2.

FIG. 3 is a schematic top view illustrating the first circuit board staked on the second circuit board of FIG. 2. In this embodiment, two second positioning posts 238 are protruded from the bottom surface of the recess 232a of the flat slab 232. In addition, these two second positioning posts 238 are arranged at two opposite sides of the test pads 212 of the second circuit board 210 (see also FIG. 2). In other words, after the first circuit board 110 is placed in the recess 232a, these two second positioning posts 238 are arranged at two opposite sides of the first circuit board 110.

After the second circuit board 210 is fixed by the positioning plate 234, the test pads 212 are not sheltered by the positioning plate 234. According to an elaborate design, when the upper edge of first circuit board 110 is contacted with the positioning plate 234, the pins 112 at the lower surface of the first circuit board 110 are directly stacked on respective test pads 212 of the second circuit board 210. In the assistance of the two second positioning posts 238, the first circuit board 110 is positioned between the two second positioning posts 238. In other words, for testing the first circuit board 110, the tester could push forward the first circuit board 110 to against the positioning plate 234 while positioning the first circuit board 110 between the two second positioning posts 238. As a consequence, the first circuit board 110 is fixed in the recess 232a of the flat slab 232 without being shifted in the X-direction or the Y-direction. Next, the pressing element 220 is placed on the stacking region of the first circuit board 110 and the second circuit board 210, thereby facilitating close contact between the first circuit board 110 and the second circuit board 210 and making electrical connection between the pins 112 and respective test pads 212. Meanwhile, the testing procedure of the display panel 100 can be done.

Since the pins 112 and respective test pads 212 are electrically connected with each other by direct contact, the display panel 100 could be easily separated from the testing device 200 without any unplugging action after the testing procedure. Similarly, for testing another display panel 100, only the step of positioning the first circuit board 110 between the two second positioning posts 238 and the step of placing the pressing element 220 on the stacking region between the first circuit board 110 and the second circuit board 210 need to be done. As a consequence, the problems resulting from repeatedly plugging/unplugging actions are obviated by using the testing device and the testing method of the present invention.

From the above description, the testing device for testing a display panel according to the present invention is easy-to-use by rendering direct contact between the test pads of the testing device and the pins of the display panel. Since the display panel is directly placed on the testing device without any plugging/unplugging action, the problems resulting from repeatedly plugging/unplugging actions are obviated. As a consequence, the damage rate of the display panel is largely reduced and the testing cost is reduced.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A testing device for testing a display panel, the display panel including a first circuit board, multiple pins being arranged on the first circuit board, the testing device comprising:
    a second circuit board comprising:
        a main body having a first surface and a second surface;
        a plurality of test pads, corresponding to respective pins of the first circuit board, arranged on the first surface of the main body;
        a plurality of testing circuits, corresponding to respective test pads, formed on the second surface of the main body;
        a plurality of conducting elements disposed through the main body for electrically connecting the testing circuits and the test pads; and
        at least one first positioning hole;
    a fixing member for fixing the second circuit board, comprising:
        a flat slab having a confined recess with a shape fitted with the first circuit board and the second circuit board in a stacked form for accommodating and positioning the second circuit board and the first circuit board, so that the first circuit board and the second circuit board in the stacked form are held by the recess; and
        at least one first positioning post, which is protruded from a bottom surface of the recess of the flat slab and corresponds to the at least one first positioning hole of the second circuit board, wherein the first positioning post and the first positioning hole are engaged with each other, so that the second circuit board is fixed in the recess; and
    a pressing element disposed on and corresponding to the test pads thereby facilitating close contact between the first circuit board and the second circuit board;
    wherein when the first circuit board is stacked on the second circuit board, the testing circuits are electrically connected to respective pins through respective conducting elements and respective test pads.

2. The testing device according to claim 1, wherein the fixing member further comprises a positioning plate for further fixing the second circuit board in the recess, and the pins of the first circuit board are in close contact with respective test pads of the second circuit board when the first circuit board is contacted with the positioning plate.

3. The testing device according to claim 1, wherein the fixing member further comprises:
    two second positioning posts protruded from a bottom surface of the recess and arranged at two opposite sides of the test pads of the second circuit board, and the second positioning posts are arranged at two opposite sides of the first circuit board after the first circuit board is placed in the recess.

4. The testing device according to claim 1, wherein the test pads are ring-shaped.

5. The testing device according to claim 4, wherein the diameter of the test pad is smaller than the width of the pin.

6. A display panel testing method, comprising steps of:
    providing a display panel including a first circuit board, wherein the first circuit board includes a plurality of pins;
    providing a testing device including a second circuit board, wherein the second circuit board has a plurality of test pads corresponding to the pins of the first circuit board;
    providing a fixing member including a flat slab with a confined recess with a specific shape for placing and positioning the second circuit board;
    providing a positioning plate for further fixing the second circuit board in the recess, wherein the test pads of the second circuit board are unsheltered by the positioning plate; and
    stacking the first circuit board on the second circuit board against the positioning plate such that the pins of the first circuit board are in close contact with and electrically connected to respective test pads of the second circuit board; and
    providing a pressing element on a stacking region of the first circuit board and the second circuit board, thereby facilitating close contact between the first circuit board and the second circuit board;
    wherein the fixing member includes at least one first positioning post and the second circuit board includes at least one first positioning hole, wherein the step of placing the second circuit board in the recess comprises a sub-step of allowing the first positioning post and the first positioning hole to be engaged with each other.

7. The display panel testing method according to claim 6, wherein the fixing member includes a plurality of second positioning posts, wherein the step of placing the first circuit board on the second circuit board comprises a sub-step of positioning the first circuit board between the second positioning posts.

8. A testing device for testing a display panel, the display panel including a first circuit board, multiple pins being arranged on the first circuit board, the testing device comprising:
    a second circuit board comprising:
        a main body having a first surface and a second surface;
        a plurality of test pads, corresponding to respective pins of the first circuit board, arranged on the first surface of the main body;
        a plurality of testing circuits, corresponding to respective test pads, formed on the second surface of the main body;
        a plurality of conducting elements disposed through the main body for electrically connecting the testing circuits and the test pads; and
        at least one first positioning hole;
    a fixing member for fixing the second circuit board, comprising:
        a flat slab having a recess with a shape fitted with the first circuit board and the second circuit board in a stacked form for accommodating the second circuit board and the first circuit board, so that the first circuit board and the second circuit board in the stacked form is held by the recess;

at least one first positioning post protruding from a bottom surface of the recess of the flat slab and corresponding to the at least one first positioning hole in a manner that the first positioning post and the first positioning hole are engaged with each other so as to fix the second circuit board in the recess; and a pressing element disposed on and corresponding to the test pads thereby facilitating close contact between the first circuit board and the second circuit board;

wherein when the first circuit board is stacked on the second circuit board, the testing circuits are electrically connected to respective pins through respective conducting elements and respective test pads.

* * * * *